United States Patent
Van der Veer et al.

(10) Patent No.: US 6,924,480 B2
(45) Date of Patent: Aug. 2, 2005

(54) APPARATUS AND METHOD FOR USING A VOLUME CONDUCTIVE ELECTRODE WITH ION OPTICAL ELEMENTS FOR A TIME-OF-FLIGHT MASS SPECTROMETER

(75) Inventors: Wytze E. Van der Veer, Irvine, CA (US); Matthew F. Appel, Irvine, CA (US); Thorsten Benter, Wuppertal (DE)

(73) Assignee: The Regents of the University of California, Oakland, CA (US)

( * ) Notice: Subject to any disclaimer, the term of this patent is extended or adjusted under 35 U.S.C. 154(b) by 233 days.

(21) Appl. No.: 10/365,800

(22) Filed: Feb. 13, 2003

(65) Prior Publication Data

US 2003/0230726 A1 Dec. 18, 2003

Related U.S. Application Data (60) Provisional application No. 60/359,580, filed on Feb. 26, 2002.

(51) Int. Cl.$^7$ .......................... H01J 37/147; H01J 49/40
(52) U.S. Cl. .................. 250/287; 250/305; 250/309; 250/396 R
(58) Field of Search ................ 250/396 R, 287, 250/305, 309

(56) References Cited

U.S. PATENT DOCUMENTS

| | | | | | |
|---|---|---|---|---|---|
| 3,621,242 A | * | 11/1971 | Ferguson et al. | ........... | 250/287 |
| 4,107,526 A | * | 8/1978 | McKinney et al. | ......... | 250/305 |
| 4,117,322 A | * | 9/1978 | McKinney | ................ | 250/309 |
| 4,775,500 A | * | 10/1988 | Funakoshi et al. | ......... | 264/461 |
| 4,808,481 A | * | 2/1989 | Luxon | ........................ | 428/407 |
| 4,855,596 A | * | 8/1989 | Gruen et al. | ................ | 250/305 |
| 4,868,455 A | * | 9/1989 | Vrijssen | ...................... | 313/451 |
| 5,126,921 A | * | 6/1992 | Fujishima et al. | .......... | 361/525 |
| 5,286,952 A | * | 2/1994 | McMills et al. | ............ | 219/535 |
| 6,052,550 A | * | 4/2000 | Thornton et al. | ........... | 399/237 |
| 6,203,972 B1 | * | 3/2001 | Katoh et al. | ................ | 430/619 |
| 2002/0182627 A1 | * | 12/2002 | Wang et al. | ................... | 435/6 |
| 2003/0060841 A1 | * | 3/2003 | Del Rio et al. | ............. | 606/167 |
| 2003/0063823 A1 | * | 4/2003 | Del Rio et al. | ............. | 384/276 |
| 2003/0161942 A1 | * | 8/2003 | Arai et al. | ..................... | 427/77 |
| 2003/0230726 A1 | * | 12/2003 | Van der Veer et al. | .. | 250/396 R |

OTHER PUBLICATIONS

Technology Focus, Bulletin of Defense Research & Development Organisation, vol. 8 No. 5, Oct. 1998, downloaded from http://www.drdo.org/pub/techfocus/oct98/nonmetal.htm.*

Du Pont Vespel Procut inbformation Bulletin, Jul. 1997, "Automotive Vespel", downloaded from http://www.dupont.com/vespel/pdflit/vesautoe.pdf.*

* cited by examiner

Primary Examiner—John R. Lee
Assistant Examiner—Bernard Souw
(74) Attorney, Agent, or Firm—Daniel L. Dawes; Myers Dawes Andras & Sherman LLP (57) ABSTRACT

A technique employing volume conductive electrodes for the generation of linear or non-linear electric fields is provided for devices used in charged ion optics. A hollow cylinder of a conductive polymer, which is loaded with conductive carbon particles or inherently conductive, and which is used to improve the performance of a dual stage gridless reflectron. Instrumental resolution measurements comparing a conventional discrete ring reflectron with a hybrid polymeric/discrete ring validate the design.

27 Claims, 5 Drawing Sheets

APPARATUS AND METHOD FOR USING A VOLUME CONDUCTIVE ELECTRODE WITH ION OPTICAL ELEMENTS FOR A TIME-OF-FLIGHT MASS SPECTROMETER

RELATED APPLICATIONS

The present application is related to U.S. Provisional Patent Application Ser. No. 60/359,580, filed on Feb. 26, 2002, which is incorporated herein by reference and to which priority is claimed pursuant to 35 USC 119.

This invention was made with Government support under Grant No. ATM-0083435, awarded by the National Science Foundation. The Government has certain rights in this invention.

BACKGROUND OF THE INVENTION

1. Field of the Invention

The invention is directed to an ion optical element used for controlling charge particle beams, typically used in mass spectrometers. More particularly, the invention is a volume or surface conductive electrode used to control charged particle beams in time of flight mass spectrometers and other devices requiring precise control of charged particles.

2. Description of the Prior Art

The control and use of charged particle beams is of considerable interest to scientists in a wide range of fields. Chemists, physicists, and biologists have all benefited from the use of these beams to probe new materials, control the momentum of interacting particles and analyze elements within complex mixtures. Imperative to all of these applications is the manipulation of the momentum of charged particles via precisely aligned electrical fields, which are generally created from discrete electrode stacks. Typically, these electrodes are produced from metallic materials e.g., stainless steel. However, researchers have recently begun to use novel, conductive materials to generate electrostatic fields. One of the disciplines that has made use of these new materials is mass spectrometry, particularly time of flight mass spectrometry (TOFMS).

Gruen et.al., *"Photo Ion. Spectrometer,"* U.S. Pat. No. 4,855,596 teaches the use of a resistive paste screen printed on a substrate to provide for control of charged particle beams in a photo ion spectrometer. This instrument utilized an electrostatic analyzer, which used a curved plate composed of a resistive thick film deposited as paste on an insulator surface. It was reported that screen-printing BIROX (Du Pont), a resistive bismuth-ruthenium oxide compound, deposited on top of a conductive paste allowed the generation of precise electrostatic fields and was ideally suited to the creation of irregularly shaped and non-linear potentials. The use of a resistive paste renders the creation of nonlinear and linear electric field very complicated.

Previous reflectrons consisted of stacks of discrete electrodes. These stacks can be expensive to manufacture and are inherently imperfect, namely the field produced by the assembly or electrodes is not precisely linear. In general, TOF instruments use a series of metal rings (electrodes) connected via bleeder networks of resistors to approximate linear fields. Combinations of these linear fields are then used to generate electrostatic lenses as well as multiple stage ion sources and reflecting devices (reflectrons). Recently, it has been proposed to combine electrodes and resistors in a bulk conductive electrode.

Others have provided an ion source with three acceleration regions was fabricated from alumina ceramic tubes brush coated with a resistive paste. Once coated, the cylinders were air fired to create a vacuum compatible conductive surface. When coupled to a 700 mm long flight tube this linear instrument provided a mass resolution of m/Δm=1200 full width half maximum.

What is needed is a design for an assembly which is inexpensive to manufacture and allows the precise generation of linear and nonlinear fields.

BRIEF SUMMARY OF THE INVENTION

The invention is defined as an ion optical device comprising a shaped electrode composed of a conductive polymer body and means for applying a voltage potential across the electrode assembly so that an electrical field with a predetermined form is created as defined by the shaped electrode. The shaped electrode in the illustrated embodiment is a solid machined polymeric body, but it may be molded, cast or formed by any other fabrication process now known or later devised. The shaped electrode is machined or otherwise formed to assume a shape according to the predetermined form of the electrical field desired.

In one embodiment the conductive polymer body is loaded with immiscible conducting bodies such as conductive particles or fibers. In another embodiment the conductive polymer body is inherently conducting according to its constituent polymer. For example, the conducting bodies are comprised of a metal powder, carbon in the form of graphite or carbon fiber. The polymer body may further be comprised of a polymer blend.

Preferably the polymer body is stable under vacuum or has no substantial outgassing under vacuum, and is chemically inert. In the specifically illustrated embodiments the polymer body is composed of a polyimide-based polymer of which a VESPEL® polymer is one, such as VESPEL® SP-22 or VESPEL® SP-262. The polymer body may alternatively be composed of a PEEK polymer. In any case, in one illustrated embodiment the polymer body is composed of a graphite loaded polymer blend with approximately 40% graphite by weight and the electrode assembly is formed in the shape of a hollow cylinder.

The ion optical device may be used in further combination with an apparatus adapted for performing momentum analysis on ions for analysis measurements by a mass spectrometer including an electrode assembly for manipulation of the momentum of charged particles via precisely aligned electrical fields, where the ion optical device operates to function as a reflectron.

The invention is also defined as an improvement in a method in charged particle optics comprising the step of providing an electromagnetic field for controlling beams of charged particles by means of a shaped volume or surface electrode composed of conductive polymer.

The step of providing the electromagnetic field for controlling beams of charged particles comprises in one embodiment the step of controlling beams of charged particles in a time-of-flight spectrometer. The step of providing the electromagnetic field for controlling beams of charged particles comprises in the illustrated embodiment the step of machining the volume or surface electrode to precisely tune the provided electromagnetic field. By this means the volume or surface electrode is precisely tuned to provide a linear or nonlinear electrical field.

It must also be expressly understood that the step of providing the electromagnetic field for controlling beams of charged particles comprises the step of controlling beams of charged particles in lenses, ion sources, or reflectrons.

The invention has four advantages:

(1) The construction is much simpler, making manufacture cheaper.

(2) The field inside the electrode is closer to the ideal shape.

(3) By machining the wall thickness of the electrode, the field can be made linear or nonlinear (e.g. quadratic).

(4) The switching speed of the electrode is faster and is without ringing.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

In an effort to create increasingly compact TOF instruments, we have focused on the application of nonmetallic volume and surface conductive polymers for the generation of these fields. Unlike the screen-printing and brush coating methods of conductive electrode design, volume conductive electrodes are particularly attractive as the electric field strength can be precisely tuned simply by machining.

In the illustrated embodiment we use a conductive polymer, such as VESPEL® SP-22 or Sp-262 (Du Pont), which a polyimide loaded with carbon black and/or carbon fiber, as a volume and surface conductive electrode for application with mass spectrometry, although it must be expressly understood that there are many equivalent substitutes that could be used for the nonmetallic volume conductive polymer. Such substitutes generically include, but are not limited to, metal fibers and particles, metal coated fibers and particles and chemical antistats. In order to test the viability of VESPEL® as a material for generation of linear and nonlinear fields, we have replaced the second stage of a dual commercial stage gridless reflectron with a solid segment of SP-22. The results obtained with this hybrid reflectron are illustrated with respect to its effects on the resolution of an existing Bruker TOF 1 mass spectrometer.

Conductive polymeric materials can be both intrinsically conducting and intrinsically insulating, i.e. polymers that contain immiscible conducting particles, e.g. metal powder or graphite. Both types of materials have found a variety of applications, which include packaging materials for devices sensitive to static electricity, corrosion inhibitors and chemical and biological sensors as well as self-lubricating bearings or ferrule material in gas chromatography. We focus on the application of polymer blends with conductive fillings as resistive ion optical electrodes.

When selecting a polymeric bulk conductive electrode material for ion optical purposes, it is advantageous that the polymer is stable in a high vacuum environment, i.e. it does not outgas, is chemically inert and exhibits the required electrical properties. Upon inspection of the commercially available conductive polymer blends, the Du Pont line of VESPEL® polymers was chosen, such as SP-22 and SP-262 as well as PEEK. Due to their unique chemical and thermal properties, these polymeric materials are especially well suited for use in the high vacuum environment of mass spectrometers. A classical application of polyimides and PEEK is in ion optics as replacements for the comparably expensive ceramic spacers used as insulators in electrode stacks. While the illustrated embodiment describes a TOF spectrometer, it is to be expressly understood that the invention is equally applicable to all applications where ion optics is utilized. For example, a common application includes X-ray and other medical radiation devices.

Polyimides usually contain both electron donating and withdrawing groups, facilitating the formation of robust charge transfer complexes both within individual units of the polymer and between adjacent chains. As a result, they are exceptionally strong and relatively non-porous, which limits chemical uptake and minimizes the degree of outgassing.

Du Pont's VESPEL® and PEEK polymers can be obtained with a wide range of graphite filler loadings. During mixing, the conductive characteristics of these polymers can be mechanically adjusted through the choice and loading of filler. Polymers with a large concentration of graphite can be highly conductive. Depending on the proximity of the carbon particles within the insulative substrate, electrons are believed to tunnel and/or hop from aggregate to aggregate. As the volume percent of carbon is increased or decreased, the bulk material will exhibit a gradual change in resistivity.

Using a cylinder of VESPEL SP-22 (40% by weight graphite) we replaced the resistive network of stainless steel electrodes from the second stage of a commercial Bruker TOF1 gridless dual stage reflectron. Overall, twelve resistively coupled stainless steel electrodes were exchanged for a 134 mm hollow cylinder of VESPEL®. Due to size constraints associated with the original segment of polyimide obtained from Du Pont, the Bruker reflectron is replaced by a scaled down version of the original. Using the ion trajectory simulation program package SIMION 7.0, it is determined that this reduction in size should have negligible impact on mass spectra obtained with the size-altered instrument.

Figure 1:
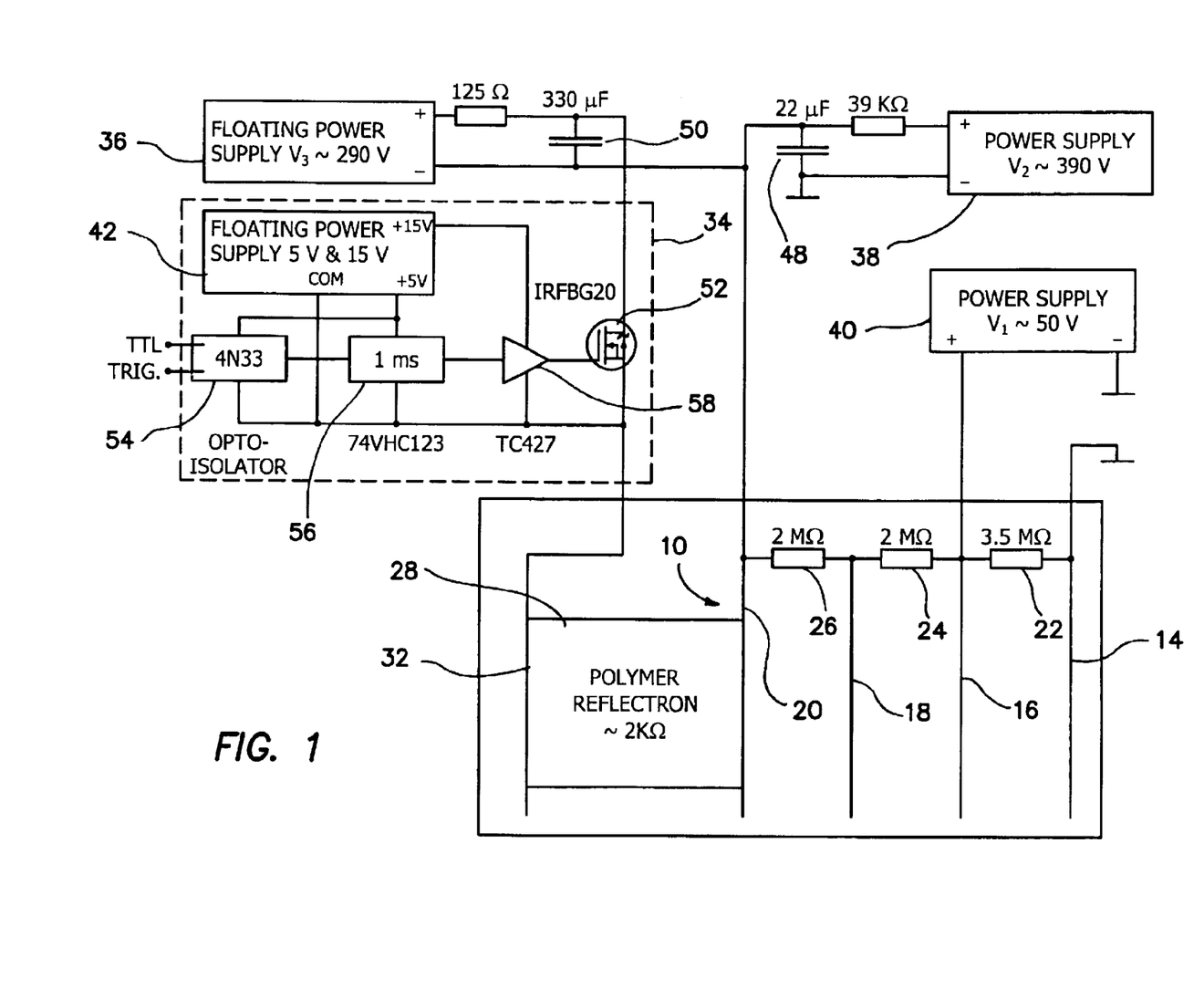
FIG. 1 is a schematic representation of the hybrid polymeric/stainless steel reflectron.
Figure 2:
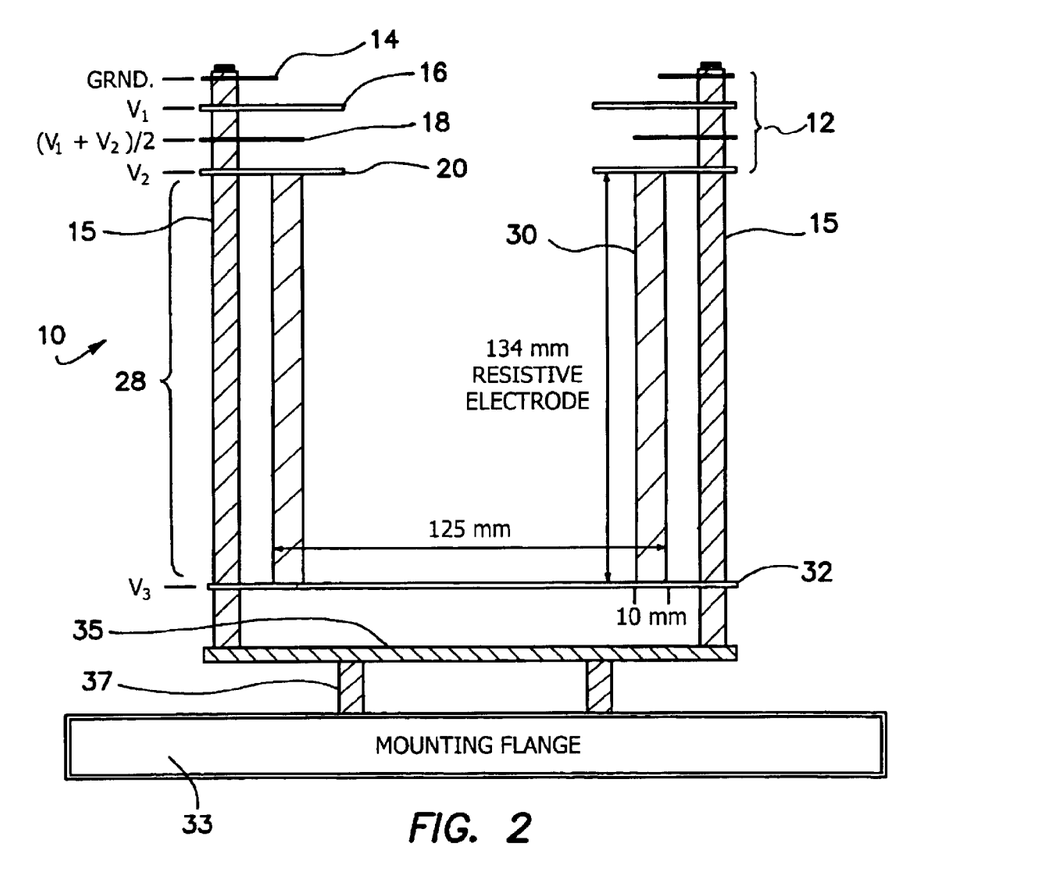
FIG. 2 is a diagram of the pulsing voltages that drives the polymeric reflectron of FIG. 1.

FIG. 1 is an electrical schematic representation of the hybrid polymeric/stainless steel reflectron used as an illustrative embodiment of the invention. A side cross-sectional view of the electrode in the reflectron 10 is shown in FIG. 2. The first stage, collectively denoted by reference numeral 12, incorporates conventional stainless steel ring elements 14, 16, 18 and 20 held in place by means of three ceramic standoffs 15 (two of which are shown in FIG. 2) and are coupled via resistors 22, 24 and 26 shown in FIG. 1. The second stage, collectively denoted by reference numeral 28, is comprised of a single, right circular, hollow cylinder 30 of Vespel® SP-22, although Vespel® SP-262 or PEEK could be substituted. Cylinder 30 is held between a basal disk 32 with an applied voltage of $V_3$ and a top ring 20 with an applied voltage of $V_2$. First ring 14 is held at ground with a voltage difference between $V_1$ and $V_2$ linearly divided between equally spaced rings 16, 18, and 20. The design and biasing of first stage 12 is conventional. The voltage difference $V_2-V_3$ is distributed across volume or surface electrode 30 according to the invention to complete the reflectron field. The reflectron 10 is mounted on a flange 33 held by insulating standoffs 37 supporting a ceramic basal plate 35 to which ceramic standoffs 32 are connected.

Figure 1A:
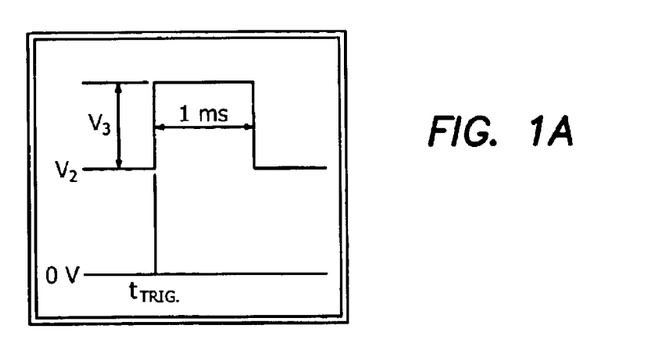
FIG. 1a is a diagram of the pulsing voltages that drives the polymeric reflectron 10 of FIG. 2.

The driving electronics of the switched hybrid reflectron 10 is depicted in FIG. 1. FIG. 1a is a diagram of the pulsing voltages that drives the polymeric reflectron 10 of FIG. 2. The voltage difference was maintained at 0 volts and pulsed to $V_3-V_2$ for a time $T_1$ around each laser shot. The voltages $V_1$ and $V_2$ are provided by two independent power supplies 40 and 38 respectively, which are part of the original electronics of the Bruker TOF1 system and a SRS PS325. The reflectron voltage $V_3$ is supplied by a Bertan 230-01 F floating power supply 36. The current to the reflectron 10 is switched by an IRF BG 20 MosFet 52 made by International Rectifier which is essentially a resistor with infinite resistance when off and about 10 Ω when on. The electronic circuit 34 of FIG. 1 is floated to the end voltage $V_3$ of the reflectron 10. The circuit 34 is triggered by a TTL pulse, which is galvanically decoupled from the high voltage via an opto-coupler 54. The trigger fires a 1 ms monostable multivibrator 56, its output pulse is further amplified by amplifier 58 to drive the MosFet 52. The voltage $V_2$ is stabilized using a capacitor 48, C=22 μF, minimizing interferences from the pulsed reflectron current. The voltage across the reflectron 10 is stabilized within the pulse to 0.1% with a 330 μF capacitor 50.

In the illustrated embodiment of FIG. 1 voltages are applied to reflectron 10 by power supplies 36, 38, 40 and 42. A pulsed voltage is supplied to electrode 28 by means of circuit 34 based on a trigger signal, trig, in order to reduce and control the ohmic heating of electrode 28 as shown in the inset in FIG. 1a. In other embodiments, it may not be necessary to pulse or vary the duty cycle of the voltage supplied to electrode 28 to control heating. The circuitry of FIG. 1 is thus dictated by the thermal properties of electrode 28 and currents in the application at hand and must be understood as not constituting any limitation or restriction on the scope of the invention.

The resistance of the overall reflectron assembly 10 is limited by two parameters. The resistance must be low enough to define the electrical potential at each point along the reflectron 10 without being affected by either the electrical field of the ions traveling inside this device or by static charges. In common designs, this is achieved by choosing an overall resistance network with R<10 MΩ. The minimum resistance is limited by heating effects and the rating of the power supplies needed to deliver the current required to maintain the potential across the reflectron 10. Heating is a design consideration only to the extent that elevated temperatures can influence the conductivity of the polymer material.

The polymeric second stage 28 of the hybrid assembly has a length of 134 mm and an outer diameter of 125 mm, which is slightly smaller than the diameter of the cylindrical VESPEL® bulk material supplied by the manufacturer. The conductivity of the material, determined by coating the end surfaces with a conductive Ag layer and measuring the resistance with a Fluke 170 DMM, is $3.4 \times 10^{-3}$ $Ω^{-1}$ $m^{-1}$. The maximum rating of the power supply providing the reflectron voltage is 15 mA at 1000V, limiting the minimum resistance to about 70 kΩ. It follows that a cylinder with the desired outside dimensions and sufficient resistance would have an unrealistic small wall thickness of 1 mm.

In order to reduce the average power requirement and hence reduce the minimum allowable resistance, the voltage across the reflectron 10 was switched from zero to high potential with a duty cycle of 1:100. The present mass spectrometer is used in conjunction with a pulsed laser ionization source and pulsed voltage source 34 that operates at a repetition rate of 10 Hz. The maximum transit time of ions with a mass m<1200 Daltons from the ionization regions 44 to the detector 46 is about 250 μs. Switching the reflectron 10 on for 1 ms around each laser shot allows ample time for the voltages to stabilize at each shot while reducing the average power by a factor 100. Using this approach we are able to use a polymer cylinder 30 with a wall thickness of 10 mm and resistance of R=2750 Ω.

Figure 3:
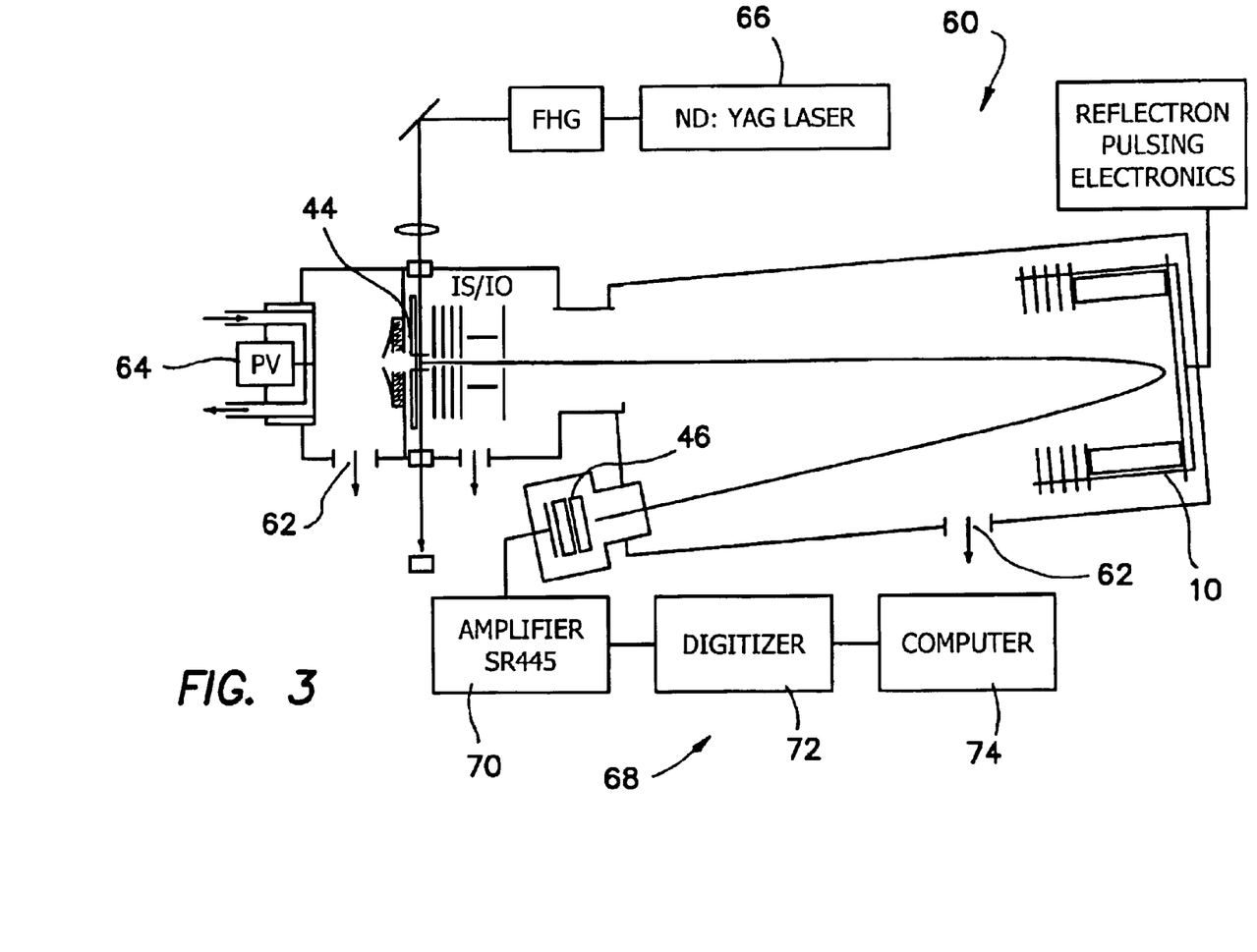
FIG. 3 is a schematic illustration of the experimental setup in which the illustrated embodiment is described.

Laser ionization experiments were performed using a Bruker TOF1 time of flight mass spectrometer 60 fitted with a differential pumping stage and conventional gas-sample inlet system 62 as diagrammatically depicted in FIG. 3. The Bruker TOF1 60 is shown with a custom-built differential pumping stage 62 and hybrid polymeric/stainless steel reflectron 10. Photo-ionization occurs roughly 5 centimeters downstream of the pulsed valve 64. In all experiments, fixed frequency radiation from laser 66 (λ=266 nm, SureLite I Nd:YAG) was used for non-resonant and near-resonant two-photon ionization of NO and benzene, gas sample respectively. Ions were detected using a detector 46 composed of two cascaded multichannel plates and fast data acquisition electronics 68 comprised of a SR44 amplifier 70, Bruker B500 digitizer 72 and Motorola MYME 68060 based VME bus computer 74 combination. For accurate determination of the system resolution, ion signal transients were recorded using a 1 GHz TDS 684 Tektronix oscilloscope (not shown).

Carrier and dilution gases Helium 5.0 and ultrapure synthetic air were obtained from Oxygen Service Co. and used without further purification. Premixed NO/Air gas (1%) and pure NO were obtained from Air Gas and used directly. Liquid benzene (Aldrich>99 vol %) was diluted with He after several pump-freeze-degassing cycles. The analyte gases were diluted using MKS mass flow controllers and a down-stream pressure regulator.

Figure 4A:
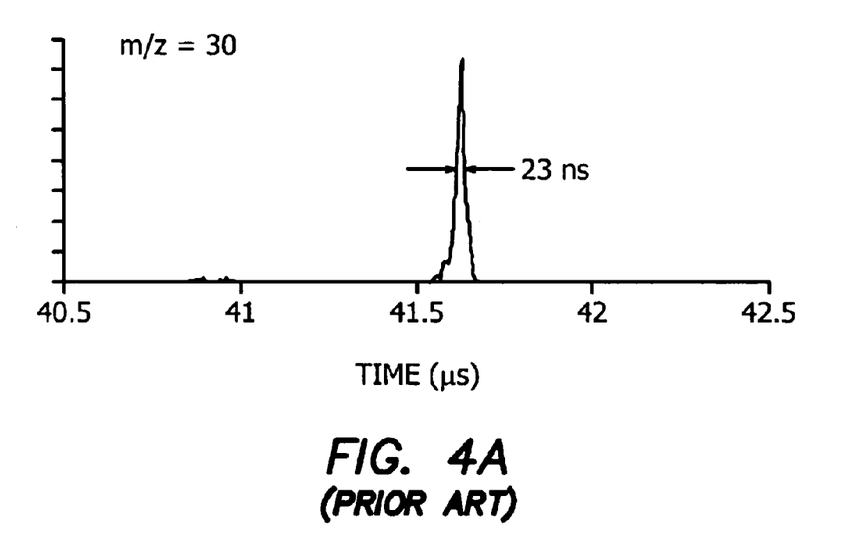
FIGS. 4a–4d is a series of graphs showing the comparison of resolution measurements obtained with the all stainless steel reflectron in FIGS. 4a and 4b and the hybrid polymeric/stainless steel reflectron in FIGS. 4c and 4d.
Figure 4B:
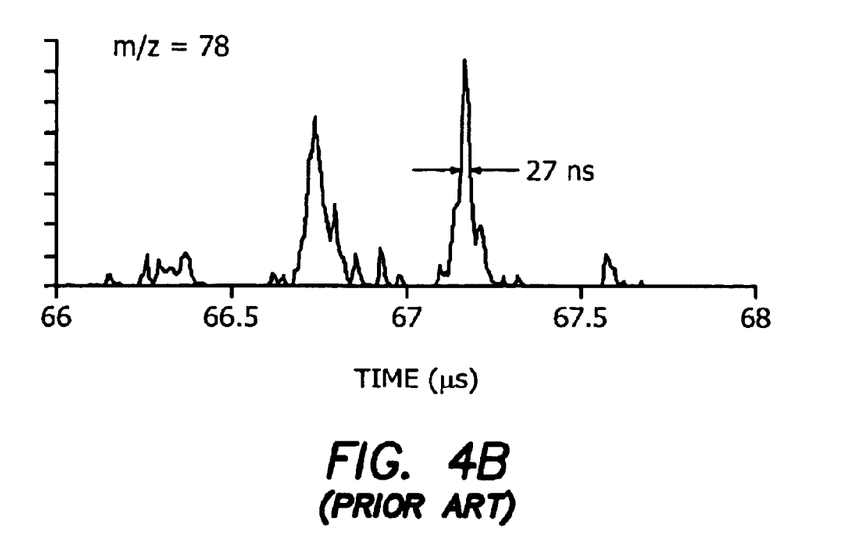
Figures 4C, 4D:
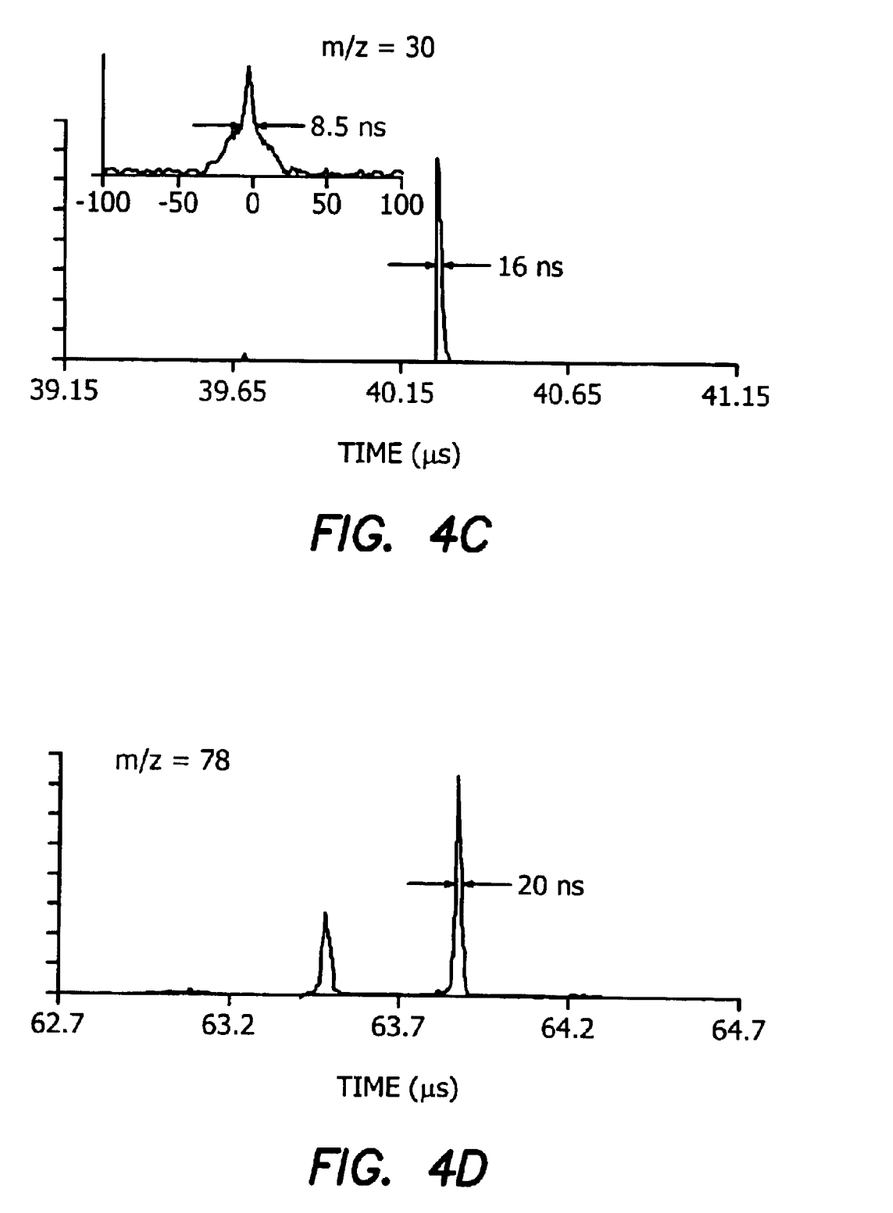

FIGS. 4a–4d is a series of graphs showing the comparison of resolution measurements obtained with the all stainless steel reflectron in FIGS. 4a and 4b and the hybrid polymeric/stainless steel reflectron in FIGS. 4c and 4d. A series of experiments were performed with NO and benzene to compare the sensitivity and resolution of a gridless dual stage hybrid reflectron 10 comprised of a VESPEL SP-22 second stage 28 and a classical stainless steel ring first stage 12. FIGS. 4a–4d presents mass spectra of benzene and NO obtained with a conventional reflectron assembly (FIGS. 4a and 4b) and the hybrid reflectron (FIGS. 4c and 4d). All spectra are the sum of 100 laser shots. Mass spectra of benzene are presented in plots FIGS. 4b and 4d and show parent ion resolutions (t/2Δt) of 1200 and 1500 respectively.

Mass spectra of NO are presented in plots FIGS. 4a and 4c and show resolutions (t/2Δt) of 900 and 1200 respectively. Spectra in FIGS. 4a–4c were obtained with a 125 MHz digitizer. The inset of FIG. 4c is recorded with a 1 GHz TDS 684 Tektronix oscilloscope. The NO peak is centered at 40.264 ps and provides a more accurate assessment of the instrumental resolution of 2300 (t/2Δt). For benzene the parent ion and its surrounding fragments are showing while only mass 30 is shown for NO. Due to the smaller diameter apertures used in the hybrid reflectron 10, higher voltages were required as compared to the prior art assembly.

Although little qualitative information can be gained from these resolution measurements, it is clearly evident that a reflectron partially composed of a carbon-filled polyimide electrode has at least equivalent resolving powers to one composed solely of metallic rings. It is pointed out that the switching cycles do not lead to any noticeable artifacts from electronic noise in the recorded mass spectra.

The application of a conductive polymer as a novel volume conductive electrode for use in ion optical devices and specifically in time of flight mass spectrometry has been presented above. Preliminary results comparing resolution data indicate that this electrode performs at least as well as the traditional resistively coupled stacked ring approach to reflectron design. However, due to the uniform nature of the electric field produced with a surface conductive electrode, we believe that a reflectron composed entirely of conductive elements sandwiched between metallic electrodes would be superior to a discrete metal electrode stack design. Additionally, the polymeric backbone ensures stability in high vacuum environments when using volume conductive electrodes. The resistance per unit of length of the electrode is directly proportional to 1/S, where S is the cross surface area. The inside and outside dimensions of the electrode can thus be machined to obtain either a linear or a nonlinear electrical field.

The use of volume conductive electrodes in all facets of charged particle optics, including lenses, ion sources, and/or reflectrons, is currently being explored and is considered as within the scope of the invention. Particularly intriguing is the generation of "ideal" methods for ion energy focusing. Here, an ion source and/or reflectron is constructed so that the voltage at any point x approximates $V_x=ax^2$, producing a field in which the time of flight of an ion is dependant only upon the square root of the mass and therefore independent of kinetic energy. At present, such a reflectron is being constructed for application with a portable time of flight analyzer that has been built by our laboratory.

In some coaxial multi-pass mass spectrometer designs a high mass resolution can be obtained by pulsing the potential over an assembly of electrodes connected through a bleeder network. However, electric ringing effects caused by the capacitances and self-inductances of the discrete electrodes and their interconnections limit the minimum rise or fall time of such a network. One approach to circumvent this oscillatory behavior is to replace the resistive bleeder network with a matched RC network, effectively trading the temporal response time of the system for damping. Ring free networks with a response time of 50 ns are disclosed in U.S. Pat. No. 6,107,625, which is incorporated herein by reference. When replacing the stack of discrete electrodes with a single bulk electrode, ring effects are expected to be much less prominent. The electrode itself behaves as a RC network, where the barrier between the carbon particles forms a capacitor and the tunnel effect between the particles forms a resistor. Response times of these materials well below 1 ns have been observed. Considering the specifications of commercially available switching components, switching times as short as 5 ns can be expected. This is particularly interesting as it may permit the construction of a compact high resolution coaxial multi-pass TOFMS. The invention thus contemplates within its cope the application of a volume conductive electrode to such a design.

The invention is directed to an ion optical element used for controlling charge particle beams, typically used in mass spectrometers. More particularly, the invention is a volume and/or surface conductive electrode used to control charged particle beams in time of flight mass spectrometers and other devices requiring precise control of charged particles. The electrical field produced using this material may be precisely tuned by machining.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An ion optical device comprising:
   a shaped electrode composed of a conductive polymer body; and
   means for applying a voltage potential across the electrode assembly so that an electrical field with a predetermined form is created as defined by the shaped electrode.

2. The ion optical device of claim 1 where the shaped electrode is machined to assume a shape according to the predetermined form of the electrical field desired.

3. The ion optical device of claim 1 where the shaped electrode is molded to assume a shape according to the predetermined form of the electrical field desired.

4. The ion optical device of claim 1 where the conductive polymer body is loaded with immiscible conducting bodies.

5. The ion optical device of claim 4 where the immiscible conducting bodies comprise particles or fibers.

6. The ion optical device of claim 1 where the conductive polymer body is inherently conducting according to its constituent polymer.

7. The ion optical device of claim 4 where the conducting bodies are comprised of a metal powder.

8. The ion optical device of claim 4 where the conducting bodies are composed of carbon.

9. The ion optical device of claim 8 where the carbon is provided in the form of graphite.

10. The ion optical device of claim 8 where the carbon is provided in the form of carbon fiber.

11. The ion optical device of claim 1 where the polymer body is further comprised of a polymer blend.

12. The ion optical device of claim 1 where the polymer body is stable under vacuum.

13. The ion optical device of claim 12 where the polymer body has no substantial outgassing under vacuum.

14. The ion optical device of claim 1 where the polymer body is chemically inert.

15. The ion optical device of claim 1 where the polymer body is composed of a VESPEL® polymer.

16. The ion optical device of claim 1 where the polymer body is composed of a polyimide-based polymer.

17. The ion optical device of claim 1 where the polymer body is composed of a PEEK polymer.

18. The ion optical device of claim 15 where the VESPEL® polymer comprises VESPEL® SP-22.

19. The ion optical device of claim 15 where the VESPEL® polymer comprises VESPEL® SP-262.

20. The ion optical device of claim 1 where the polymer body is composed of a graphite loaded polymer blend with approximately 40% graphite by weight.

21. The ion optical device of claim 1 where the electrode assembly comprises a hollow cylinder.

22. The ion optical device of claim 1 in further combination with an apparatus adapted for performing momentum analysis on ions for analysis measurements by a mass spectrometer including an electrode assembly for manipulation of the momentum of charged particles via precisely aligned electrical fields, where the ion optical device operates to function as a reflectron.

23. An improvement in a method in charged particle optics comprising providing an electromagnetic field for controlling beams of charged particles by means of a shaped volume or surface electrode composed of conductive polymer.

24. The improvement of claim 23 where providing the electromagnetic field for controlling beams of charged particles comprises controlling beams of charged particles in a time-of-flight spectrometer.

25. The improvement of claim 23 where providing the electromagnetic field for controlling beams of charged particles comprises machining the volume or surface electrode to precisely tune the provided electromagnetic field.

26. The improvement of claim 25 where machining the volume or surface electrode to precisely tune the provided electromagnetic field tunes the field to a linear or nonlinear electrical field.

27. The improvement of claim 23 where providing the electromagnetic field for controlling beams of charged particles comprises controlling beams of charged particles in lenses, ion sources, or reflectrons.

* * * * *